(12) United States Patent
Wagenbach et al.

(10) Patent No.: US 11,165,211 B2
(45) Date of Patent: Nov. 2, 2021

(54) DEVICE AND METHOD FOR PRODUCING A TESTED WELD JOINT

(71) Applicant: SCHUNK SONOSYSTEMS GMBH, Wettenberg (DE)

(72) Inventors: Udo Wagenbach, Buseck (DE); Reiner Schmidt, Lollar (DE); Alexander Schuch, Staufenberg (DE); Sebastian Ruehl, Wetter (DE); Stephan Becker, Marburg (DE)

(73) Assignee: SCHUNK SONOSYSTEMS GMBH, Wettenberg (DE)

( * ) Notice: Subject to any disclaimer, the term of this patent is extended or adjusted under 35 U.S.C. 154(b) by 191 days.

(21) Appl. No.: 16/321,232

(22) PCT Filed: Jul. 18, 2017

(86) PCT No.: PCT/EP2017/068154
§ 371 (c)(1),
(2) Date: Jan. 28, 2019

(87) PCT Pub. No.: WO2018/024481
PCT Pub. Date: Feb. 8, 2018

(65) Prior Publication Data
US 2019/0173251 A1   Jun. 6, 2019

(30) Foreign Application Priority Data
Aug. 2, 2016 (DE) ............ 10 2016 214 227.5

(51) Int. Cl.
*B23K 31/00* (2006.01)
*H01R 43/02* (2006.01)
(Continued)

(52) U.S. Cl.
CPC ........ *H01R 43/0207* (2013.01); *B23K 20/10* (2013.01); *B23K 31/125* (2013.01); *H01L 24/78* (2013.01); *B23K 2101/38* (2018.08)

(58) Field of Classification Search
CPC .............. H01R 43/0207; H01L 24/78; B23K 20/10–106; B23K 31/125; B23K 2101/38; B23K 1/06; B23K 2101/32; G01N 29/265
(Continued)

(56) References Cited

U.S. PATENT DOCUMENTS 4,596,352 A * 6/1986 Knapp ............... B23K 20/106
228/1.1
4,869,419 A * 9/1989 Nuss .................. B23K 20/106
228/110.1
(Continued)

FOREIGN PATENT DOCUMENTS

CN          1316100 A    10/2001
CN        101146640 A     3/2008
(Continued)

OTHER PUBLICATIONS

Machine translation of DE-102006049624-A1 (date unavailable).*

*Primary Examiner* — Kiley S Stoner
(74) *Attorney, Agent, or Firm* — Dickinson Wright PLLC; Andrew D. Dorisio

(57) ABSTRACT

The invention relates to a device and to a method for producing a tested weld joint between two contact elements (11, 12), which are joined together in a welding plane S, comprising a compressing space for accommodating the contact elements (11, 12), said compressing space being delimited by a work surface of a sonotrode, which transmits ultrasonic oscillations, and a counter-surface (15) of a counter-electrode (16) in a first axial direction at two opposing sides and by delimiting surfaces of opposing delimiting elements in a second axial direction at two opposing sides, (Continued)

said device comprising a test head (27) next to the compressing space, and said test head being able to be transferred from a position outside of the compressing space to a position within the compressing space in such a manner that the test head (27) is disposed within the open compressing space in a test mode of the device for subjecting a contact element (12) of the previously produced weld joint to a shear force essentially oriented parallel to the welding plane S, and said test head (27) being disposed outside of the compressing space in a welding mode of the device for producing the weld joint.

19 Claims, 3 Drawing Sheets

(51) Int. Cl.
  *B23K 20/10* (2006.01)
  *B23K 31/12* (2006.01)
  *H01L 23/00* (2006.01)
  *B23K 101/38* (2006.01)

(58) Field of Classification Search
  USPC ............... 228/1.1, 110.1, 102–104, 8–12; 156/73.1–73.4, 580.1–580.2
  See application file for complete search history.

(56) References Cited

U.S. PATENT DOCUMENTS

| | | | | |
|---|---|---|---|---|
| 5,196,079 | A * | 3/1993 | Sager | B29C 65/0681 |
| | | | | 156/158 |
| 6,564,115 | B1 | 5/2003 | Kinnaird | |
| 2007/0000890 | A1 * | 1/2007 | Steiner | B23K 11/0026 |
| | | | | 219/124.34 |
| 2007/0257088 | A1 * | 11/2007 | Steiner | H01L 24/85 |
| | | | | 228/110.1 |
| 2008/0032569 | A1 * | 2/2008 | Steiner | B23K 20/10 |
| | | | | 439/874 |
| 2009/0013786 | A1 * | 1/2009 | Gassert | B06B 1/0618 |
| | | | | 73/579 |
| 2011/0155701 | A1 * | 6/2011 | Gerst | B23K 11/0026 |
| | | | | 219/117.1 |
| 2016/0116355 | A1 * | 4/2016 | Stroh | D07B 1/06 |
| | | | | 702/43 |
| 2016/0136753 | A1 * | 5/2016 | Ruhl | B23K 20/2333 |
| | | | | 228/110.1 |
| 2016/0294140 | A1 * | 10/2016 | Trube | B23K 20/106 |
| 2018/0200827 | A1 * | 7/2018 | Strobel | B23K 20/10 |

FOREIGN PATENT DOCUMENTS

| | | | | |
|---|---|---|---|---|
| CN | 102870292 | A | 1/2013 | |
| CN | 105324230 | A | 2/2016 | |
| DE | 3437749 | A1 * | 4/1986 | ......... H01R 43/0207 |
| DE | 19752319 | A1 | 5/1998 | |
| DE | 102004012098 | B3 | 8/2005 | |
| DE | 102004022313 | B3 * | 10/2005 | ............. B29C 66/50 |
| DE | 102005004899 | A1 * | 8/2006 | ............ B23K 20/106 |
| DE | 102006021422 | A1 * | 11/2007 | ......... H01R 43/0207 |
| DE | 102006049624 | A1 * | 4/2008 | ............ B23K 20/005 |
| DE | 102010050387 | A1 | 6/2011 | |
| DE | 102012111734 | A1 * | 6/2014 | ............ B23K 20/106 |
| DE | 102013107637 | A1 * | 1/2015 | ......... B23K 20/2333 |
| DE | 102014013452 | A1 | 3/2016 | |
| DE | 102015222013 | B3 * | 11/2016 | ......... B23K 37/0452 |
| JP | 2006015354 | A | 1/2006 | |
| WO | WO-0243915 | A1 * | 6/2002 | ............ B23K 20/004 |
| WO | WO-2005042202 | A1 * | 5/2005 | ............ B23K 31/125 |
| WO | WO2005042202 | A1 | 12/2005 | |
| WO | WO-2006005509 | A1 * | 1/2006 | ............ B23K 20/004 |
| WO | WO-2006010551 | A2 * | 2/2006 | ......... H01R 43/0207 |
| WO | WO-2007042235 | A1 * | 4/2007 | ............. B23K 20/10 |

* cited by examiner

DEVICE AND METHOD FOR PRODUCING A TESTED WELD JOINT

BACKGROUND OF THE INVENTION

The invention relates to a device for producing a tested weld joint between two contact elements joined together in a welding plane S, comprising a compressing space for accommodating the contact elements, said compressing space being delimited by a work surface of a sonotrode transmitting ultrasonic oscillations and a counter-surface of a counter-electrode in a first axial direction at two opposing sides and by delimiting surfaces of opposing delimiting elements in a second axial direction at two opposing sides, and at least one delimiting element being realized as a lateral slider element realized so as to be displaceable by means of an advancing device with respect to the counter-electrode. In addition, the invention relates to a method for producing a tested weld joint produced between two contact elements in a welding plane.

Devices of the make mentioned above are commonly used by the applicant for producing a weld joint, referred to as a terminal joint in the following, between a connection end of a wire conductor and a connection device commonly realized as a sheet metal part and often referred to as a terminal in technical terms. In this context, the connection end of the wire conductor and the connection device form contact elements of the terminal connection joined together in a welding plane by means of the ultrasonic connection.

In this context, the connection end of the wire conductor can be formed directly by the strand of the wire conductor, the plane of said strand fitting snuggly against a contact tab of the contact device in the welding plane during the subjection to ultrasound via the sonotrode, or also by a contact surface element, which is also realized as a sheet metal part and is connected to the strand of the wire conductor for forming the contact end of the wire conductor before producing the weld joint. In this instance, both contact elements are made of sheet metal.

To produce tested weld joints, it is known from DE 10 2014 013 452 A1 to test the process parameters or the geometry of the joint arrangement produced in the compressing space in situ while producing the weld connection in the compressing space and to automatically activate a measuring device upon detecting faults, e.g. exceeding of defined threshold values, in order to render impossible a subsequent use of the faulty wire conductor, which is welded to the terminal, by severing the wire conductor from the terminal.

Alternatively or also in combination with the aforementioned in-situ test of the weld joint by means of monitoring process parameters or the geometry of the joint arrangement produced in the welding procedure, mechanical stress tests of the joint arrangement are conducted at least intermittently in terminal connections, in which the connection end of a wire conductor is welded to a terminal, in order to ensure that the terminal connection does not succumb to the mechanical stresses occurring during the intended use of the terminal connection. For this purpose, a shear test is conducted on the terminal connections, in which the contact elements are subjected to a shear force in the welding plane and transverse to the longitudinal extension of the wire conductor. Hitherto, these tests have been conducted following the welding procedure and the removal of the joint arrangement produced in the welding procedure from the compressing space. An additional handling of the terminal connection is associated therewith, wherewith only fairly few terminal connections of a production batch are tested in practice due to the expenditure associated therewith.

SUMMARY OF THE INVENTION

The object of the invention at hand is to propose a device and a method which simplifies executing mechanical tests on terminal connections.

In order to attain this object, the device according to the invention has the features of claim 1.

According to the invention, the device comprises a test head which is next to the compressing space and is provided with an advancing device for advancing the test head towards an advancing axis parallel to the welding plane, and the counter-surface serves for accommodating a contact element in a fixating manner in the direction of the advancing axis, said test head being able to be transferred from a position outside of the compressing space to a position within the compressing space in such a manner that the test head is disposed within the open compressing space in a test mode of the device for subjecting the other contact element of the previously produced weld joint to a shear force oriented essentially parallel to the welding plane, and the test head is disposed outside of the compressing space in a weld mode of the device in order to produce the weld joint.

Accordingly, the device according to the invention enables executing the mechanical test of the terminal connection while the terminal connection is still in the compressing space. Therefore an additional handling of the terminal connection for executing the mechanical test is not necessary. Indeed, the terminal connection remains in position in the compressing space after executing the welding procedure and is not removed from the compressing space until after the mechanical tests have been executed. Thus, the number of the actually tested terminal connections of a production batch can be increased significantly without having to undertake a drastic increase of the production time of a production batch.

Preferably, the advancing device of the test head is formed by the advancing device of the lateral slider element so that a separate advancing device is not intended for advancing the test head.

If the test head is disposed at the lateral slider element, it can be used for mounting the test head.

In a preferred embodiment, the test head is disposed at a lateral slider head connected in an exchangeable manner to a lateral slider carrier of a lateral slider element so that retrofitting a weld device commonly used for producing terminal connections becomes possible via a simple exchange the lateral slider head.

If the test head is pivotally connected to the lateral slider element, the test head can be swiftly transferred to the compressing space.

For this purpose, it is particularly advantageous if the test head is connected to the lateral slider element by means of pivot axis extending parallel to the counter-surface of the counter-electrode and in a third axial direction transverse to the advancing direction of the lateral slider element so that a drive device for pivoting the test head can be provided above the lateral slider element and thus the accessibility of the compressing space is impeded as little as possible.

A particularly compact solution for arranging the test head directly next to the compressing space is derived if the test head can be pivoted with respect to the lateral slider element by means of a drive device disposed at the lateral slider element.

Preferably, the test head comprises a contact element accommodation having a hold-down device, which is disposed essentially parallel to the welding plane, and a force transmission device for transmitting force to the contact element. By means of a test head realized in this manner it is ensured that the test force acting on the contact partner from the test head acts within the welding plane since it is prevented in particular via the formation of the contact element accommodation that the contact element subjected to the test force lifts off of the other contact element.

If the force transmission device is disposed such that it is oriented at a lateral offset so as to be displaced to a middle axis of the contact element, said middle axis extending parallel to the advancing axis of the test head and said contact element being disposed on the counter-surface, the shear force can be superposed by a shear moment.

If the contact element accommodation has a rotation stop effective in the first axial direction, it can also be prevented when necessary, on the other hand, that the contact element subjected to the test force rotates in the welding plane with respect to the other contact element.

Preferably, the hold-down device is realized as an abutment surface parallel to the welding plane S, the rotation stop is realized as an abutment edge, and the force transmission device is realized as a stop edge so that the hold-down device, the rotation stop and the subjection surface form a defined corner of the space and the test force is transferred evenly across the entire width of the contact element and a rotation of the contact element is precluded.

It is particularly preferred if a processing device is disposed next to the compressing space, said processing device enabling processing a wire conductor connected to a contact element or a terminal connected to the contact element following the test procedure.

Preferably, the processing device is realized as a severing device for severing the wire conductor, so if the connection arrangement fails in the shear test, the wire conductor can be severed to render the connection arrangement useless immediately after.

It is just as advantageous if the processing device is realized as a reshaping device for reshaping the terminal, so if the connection arrangement fails in the shear test, the terminal can be reshaped or not in order to mark the connection arrangement as being useless.

In order to attain the object invention, the method according to the invention has the features of claim 15.

According to the invention, to execute the test procedure following the welding procedure, a test head disposed outside of the compressing space during the welding procedure, which is executed in the welding mode of the device and in which the compressing space is closed via the sonotrode, is brought into a position within the compressing space in a test mode of the device, in which the compressing space is open, a contact element of the weld joint remaining in the welding position being subjected to a shear force in the direction of an advancing axis of the test head in order to execute the test and the other contact element being retained in a fixating manner on the counter-surface in the opposite direction of the advancing direction of the test head.

To execute the test procedure in the test mode of the device, the test head is pivoted from a position, which is disposed above the lateral slider element in the welding mode of the device, to a test position in the open compressing space.

If the test procedure is executed depending on at least one process parameter determined during the welding procedure, the test can always be executed independently of a fixed testing roster, which, for example, intends a defined test frequency in such a manner that each $n^{th}$ terminal connection is tested, if significant deviations are detected in a process parameter. Such process parameters can be the power consumption of the sonotrode or of a converter connected to the sonotrode, the welding time or even a geometric parameter of the weld joint, for example.

To execute the test procedure, a power transmission device of the test head preferably is displaced so as to abut against the contact element and then the force is steadily increased.

If the advancing device of the test head is provided with a path measuring device in such a manner that the advancing path of the test head is measured while the force is increased, a bad-part definition of the terminal connection can be carried out, in particular in the event that a contact element is realized as a strand, when the contact element is being compromised too greatly, e.g. when there is a too great force-path deviation.

Independently of the parameter defined for the bad-part definition, it is of advantage for the documentation of the test procedure and/or of the test result if the relevant data and their allocation to the tested terminal connection is documented and saved simultaneously, in particular a log file is generated.

If a contact element is marked with a test marking when executing the test procedure, it becomes possible to verify the executed test simultaneously to executing the test procedure.

Preferably, the force exerted via the test head is measured during the test procedure in order to sever the wire conductor connected to the contact element by means of a severing device should a defined test force be fallen below.

Alternatively, the shear force exerted via the test head can be measured during the test procedure, and the reshaping of a contact element for producing a mechanical connection between the contact element and a wire conductor connected to the contact element can be suppressed by means of a reshaping device acting on the contact element should a test force defined as a target value be fallen below.

BRIEF DESCRIPTION OF THE DRAWINGS

In the following, a preferred embodiment of the device is further described by means of the drawing, with descriptions of the method to be executed by means of the device.

In the following.

DETAILED DESCRIPTION OF THE INVENTION

Figure 1:
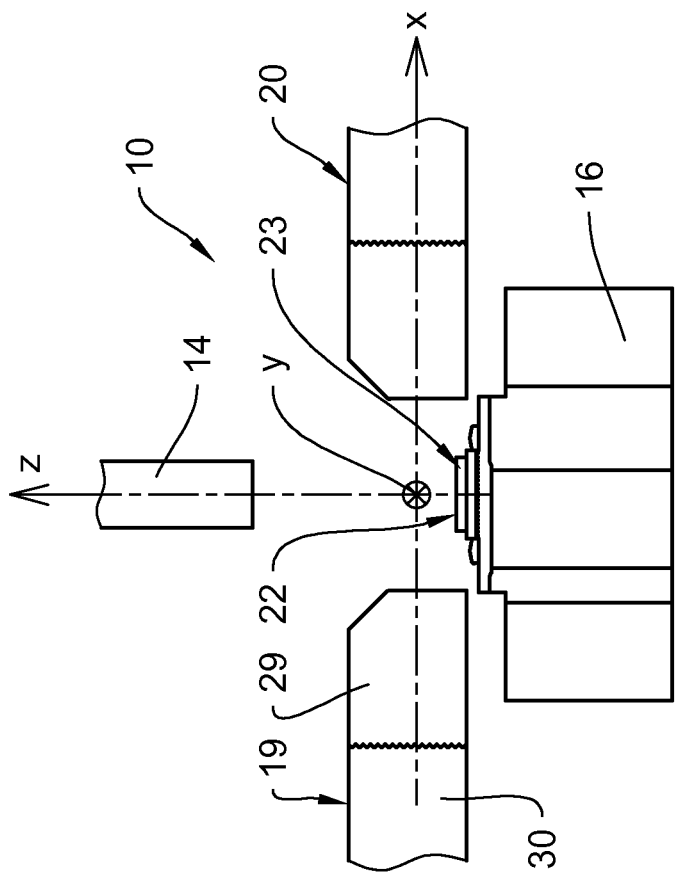
FIG. 1 illustrates a device according to the state of the art having a closed compressing space.

FIG. 1 illustrates a compressing space 10 of a device according to the state of the art while an ultrasonic welding procedure takes place. While the welding procedure takes place, the compressing space 10 accommodates a lower contact element 11 and an upper contact element 12 and is delimited by a work surface 13 of a sonotrode 14, which is subjected to ultrasonic oscillations in the direction of the y-axis, and a counter-surface 15 of a counter-electrode, which is realized like an anvil, in a first axial direction, defined by the z-axis in this instance, at two opposing sides.

Figure 2:
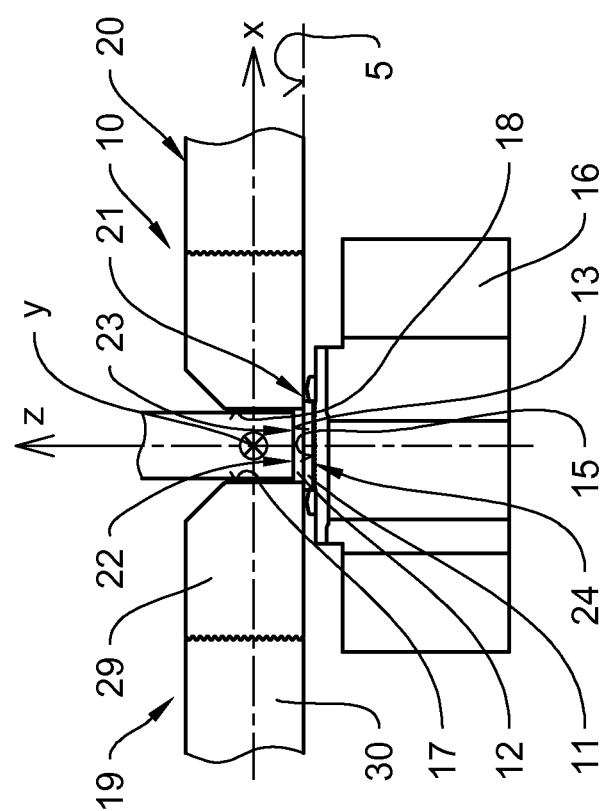
FIG. 2 illustrates the device according to the state of the art having an open compressing space.

In a second axial direction defined by the x-axis in this instance, the compressing space 10 of opposing delimiting surfaces 17, 18 of delimiting elements is delimited, said delimiting elements each being formed by a lateral slider element 19, 20 which can each be displaced towards the x-axis with respect to the counter-electrode 16 in this instance, as illustrated in particular in FIG. 2.

In the welding mode illustrated in FIG. 1, in which the contact elements 11, 12 are in a defined superjacent arrangement in the welding position, the lower contact element 11 is accommodated in an anvil accommodation 21, which fixes the contact element 11 in the direction of the x-axis. The upper contact element 12, which is pressed against the contact element 11 by the sonotrode 14 at a defined pressure, is between the lower contact element 11 and the work surface 13 of the sonotrode 14. The position of the upper contact element 12 relative to the lower contact element 11 is defined in the welding mode by the delimiting surfaces 17, 18 of the lateral slider elements 19, 20 which are displaced against the upper contact element 12 in the direction of the x-axis. In this relative arrangement of the contact elements 11, 12 within the closed compressing space 10, a subjection of the sonotrode 14 to oscillations causes the contact elements 11, 12 to be welded in a welding plane S formed between the contact elements 11, 12.

Figure 3:
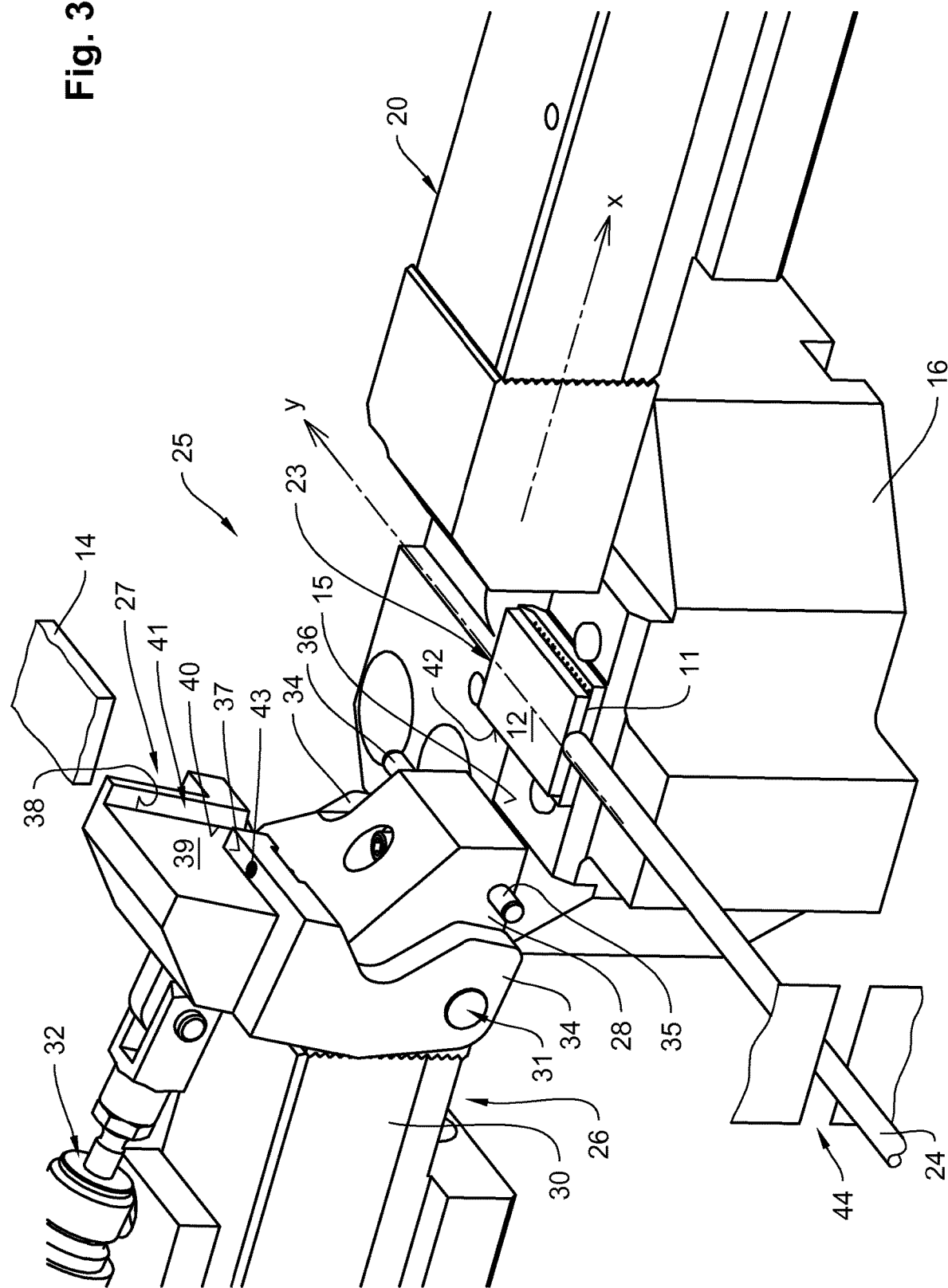
FIG. 3 illustrates an embodiment of the device according to the invention having a test head disposed outside of the compressing space.

In this instance, the two contact elements 11, 12 illustrated in FIGS. 1 and 2 are, in the case of the lower contact element 11, a contact end of a terminal 22 made of sheet metal and, in the case of the upper contact element 12, a strand end of a wire conductor 24 connected to the terminal 22 for producing a terminal connection 23, said strand end being compressed nearly rectangular in its cross section owing to the pressurization via the sonotrode 14 (FIG. 3).

After producing the weld joint in the compressing space 10 illustrated in FIG. 1, the compressing space 10 is opened, as illustrated in FIG. 2, in such a manner that the lateral slider elements 19, 20 are displaced in the direction of the x-axis and the sonotrode 14 is displaced in the direction of the z-axis, and the finalized terminal connection 23 can be removed from the compressing space 10.

FIG. 3 illustrates an embodiment of the device according to the invention having a compressing space 25 in an isometric view in a configuration corresponding to FIG. 2, i.e. after the welding procedure has been executed with a terminal connection 23 still disposed in the compressing space 25 in the welding position, though components formed in congruence with the compressing space 10 illustrated in FIG. 2 have identical reference numerals in FIG. 3.

As a comparison between FIGS. 3 and 2 elucidates, the compressing space 25 comprises a lateral slider element 26 provided with a test head 27 in contrast to the compressing space 10 which does not comprise a lateral slider element 26. The test head 27 is disposed on a lateral slider head 28 which is disposed in an exchangeable manner on a lateral slider carrier 30 like a lateral slider head 29 of the lateral slider element 19.

As FIG. 3 illustrates, the test head 27 is mounted on the lateral slider head 28 at a pivot axis 31 extending transverse to the advancing direction of the lateral slider element 26, i.e. transverse to the x-axis and parallel to the counter-surface 15 of the counter-electrode 16 in this instance. As a pivot drive for the test head 27, the test head 27 is connected to a drive device 32 which is realized as a pneumatic cylinder in this instance and is disposed on the lateral slider carrier 30.

FIG. 3 illustrates the test head 27 in a relative arrangement on the lateral slider element 26 outside of the compressing space 25 in which the test head 27 is disposed while the welding procedure is being executed, i.e. while the welding device is in the welding mode.

After transferring the compressing space 25 to the open position which is illustrated in FIG. 3 and in which the lateral slider elements 26, 20 are disposed at a distance to the contact elements 11, 12 and the sonotrode 14 is lifted upward from the contact elements 11, 12, the terminal connection 23 remains in the welding position on the counter-electrode 16 in conjunction with the contact elements 11, 12, which are welded together in the welding plane S, following the welding procedure, the lower contact element 11 remaining in the anvil accommodation in a fixating manner in the direction of the x-axis.

Starting from the non-operation position illustrated in FIG. 3, the test head 27 is pivoted to its operating or test position in order to execute a test procedure, said test position of the test head 27, in the instance of the present exemplary embodiment, being defined by a stop of pivot arms 33, 34 of the test head against pivot stops 35, 36 disposed on the lateral slider head 28, said pivot arms 33, 34 being articulately mounted on the pivot axis 31. Starting from this test position of the test head 27, the test head 27 is displaced against a longitudinal edge 42 of the upper contact element 12, which extends in the direction of the y-axis, in conjunction with a stop edge 37, which is illustrated in FIG. 3 and forms a contact element accommodation 41 formed as a space corner at an underside 40 of the test head 27 in conjunction with an abutment edge 38 and an abutment surface 39, which are each oriented perpendicular to the stop edge 37.

Figure 4:
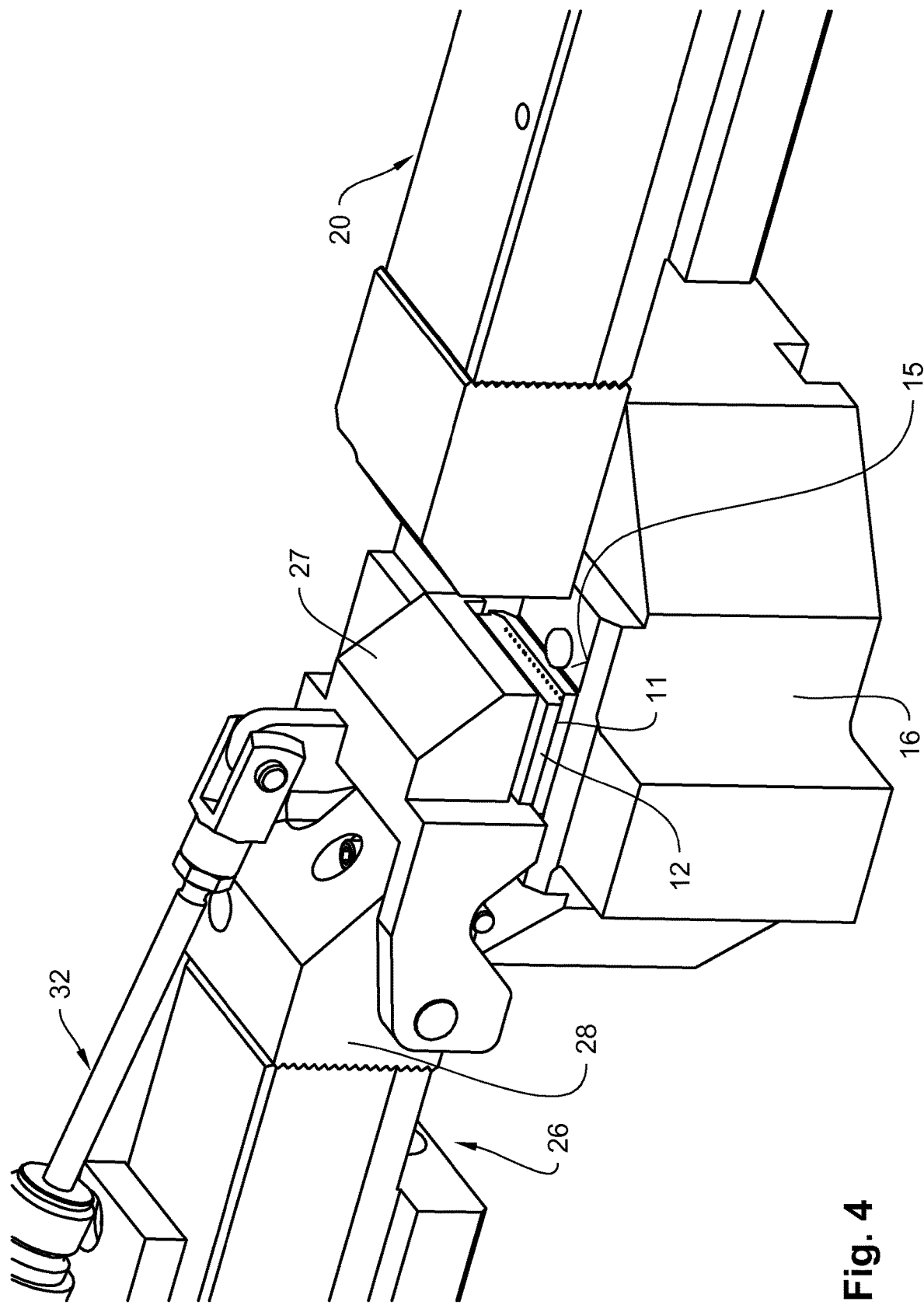
FIG. 4 illustrates the device illustrated in FIG. 3 having a test head pivoted in the compressing space.

As FIG. 4 illustrates, the upper contact element 12 is accommodated such in the contact element accommodation 41, which is formed on the test head 27, in the force transmission position of the test head 27 attained after the stop edge 37 has abutted against the longitudinal edge 42 of the upper contact element 12 that the abutment surface 39 acts as a hold-down device and the abutment edge 38 acts as a rotation stop. Should the upper contact element 12 be subjected to a transverse force, which causes a shear force in the welding plane S, in the direction of the x-axis by the advancing device of the lateral slider element 26 being actuated, it is thus precluded that the upper contact element 12 deviates in the direction of the z-axis and the y-axis and only a deviation in the direction of the x-axis becomes possible.

As illustrated in FIG. 3, the stop edge 37 is provided with a test stamp 43 which enables applying a test marking on the upper contact element 12. Should a test force defined as a target value be fallen below, the wire conductor 24 connected to the upper contact element 12 can be severed by means of a severing device 44 disposed right next to the compressing space 25 in the direction of the y-axis, as illustrated in FIG. 3, in order to preclude a use of a terminal connection 23 identified as being faulty after falling below the test force.

The invention claimed is:

1. A device for producing a tested weld joint between two contact elements (11, 12) joined together in a welding plane (S), comprising a compressing space (25) for accommodating the contact elements (11, 12), said compressing space (25) being delimited by a work surface (13) of a sonotrode (14), which transmits ultrasonic oscillations, and a counter-surface (15) of a counter-electrode (16) in a first axial direction at two opposing sides and by two delimiting surfaces (17, 18) of opposing delimiting elements in a second axial direction at two opposing sides, and at least one delimiting element being a lateral slider element (26) which is displaceable by an advancing device of the lateral slider element (26) with respect to the counter-electrode (16), characterized in that the device comprises a test head (27) which is adjacent to the compressing space (25) and is provided with an advancing device for advancing the test head (27) towards an advancing axis parallel to the welding plane (S), and in that the counter-surface (15) serves for accommodating a contact element (11) in a fixating manner in the direction of the advancing axis, said test head being able to be transferred from a position outside of the compressing space to a position within the compressing space in such a manner that the test head (27) is disposed within the open compressing space (25) in a test mode of the device for subjecting the other contact element (12) of the previously produced weld joint to a shear force oriented essentially parallel to the welding plane (S), and in that the test head (27) is disposed outside of the compressing space (25) in a welding mode of the device for producing the weld joint;

wherein the advancing device of the test head (27) is formed by the advancing device of the lateral slider element (26).

2. The device according to claim 1, characterized in that the test head (27) is disposed at the lateral slider element (26).

3. The device according to claim 1, characterized in that the test head (27) is disposed on a lateral slider head (28) connected to a lateral slider carrier (30) of the lateral slider element (26) in an exchangeable manner.

4. The device according to claim 2, characterized in that the test head (27) is connected to the lateral slider element (26) in a pivotable manner.

5. The device according to claim 4, characterized in that the test head (27) is connected to the lateral slider element (26) about a pivot axis (31) extending parallel to the counter-surface (15) of the counter-electrode (16) and in a third axial direction transverse to the advancing device of the lateral slider element (26).

6. The device according to claim 5, characterized in that the test head (27) can be pivoted by a drive device (32), which is disposed at the lateral slider element (26), with respect to the lateral slider element (26).

7. The device according to claim 1, characterized in that the test head (27) comprises a contact element accommodation (41) having a hold-down device, which is disposed essentially parallel to the welding plane (S), and a force transmission device for transmitting force to the contact element (12).

8. The device according to claim 7, characterized in that the force transmission device is disposed such that it is oriented at a lateral offset to a middle axis of the contact element, said middle axis extending parallel to the advancing axis of the test head (27) and said contact element being disposed on the counter-surface.

9. The device according to claim 7, characterized in that the contact element accommodation comprises a rotation stop effective against a rotation around the first axial direction.

10. The device according to claim 9, characterized in that the hold-down device is realized as an abutment surface (39) disposed parallel to the welding plane (S), the rotation stop is an abutment edge (38), and the force transmission device is realized as a stop edge (37).

11. The device according to claim 1, characterized in that a processing device, which enables a processing of a wire conductor connected to a contact element (12) or of a terminal connected to the contact element subsequent to the test procedure, is disposed adjacent to the compressing space (25).

12. The device according to claim 11, characterized in that the processing device is a severing device (44) for severing the wire conductor (22).

13. The device according to claim 11, characterized in that the processing device is a reshaping device for reshaping the terminal (22).

14. A method for producing a tested weld joint produced in a welding plane (S) between contact elements (11, 12), a compressing space (25) being opened subsequent to a welding procedure executed in a welding position of the contact elements (11, 12) in a compressing space (25), which is delimited by a work surface (13) of a sonotrode (14) transmitting ultrasonic oscillations and a counter-surface (15) of a counter-electrode (16) in a first axial direction at two opposing sides and by opposing delimiting elements in a second axial direction at two opposing sides via delimiting surfaces (17, 18), characterized in that a test head (27) disposed outside of the compressing space during the welding procedure, which is executed during the welding mode of the device and in which the compressing space (25) is closed by the sonotrode (14), is brought into a position within the open compressing space in a test mode of the device, in which the compressing space (25) is open and executes a test procedure subsequent to the welding procedure, a contact element (12) of the weld joint remaining in the welding position being subjected to a shear force in the direction of an advancing axis of the test head in order to execute the test procedure and the other contact element (11) being retained on the counter-surface (15) in a fixating manner in the opposite direction of the advancing device of the test head (27);

wherein the test procedure is executed depending on at least one process parameter determined during the welding procedure;

wherein during the test procedure, the force exerted via the test head (27) is measured or the advancing path of the test head (27) is measured and in that a wire conductor (24), which is connected to a contact element (12), is severed by a severing device (44) when a test force defined as a target value has fallen below or an advancing path defined as a maximal path be exceeded.

15. The method according to claim 14, characterized in that the test head (27) is pivoted from a position disposed above the lateral slider element (26) in the welding mode of the device to a test position in the open compressing space (25) to execute the test procedure in the test mode of the device.

16. The method according to claim 15, characterized in that a force transmission device of the test head (27) is displaced so as to stop at the contact element (12) and the force is increased to execute the test procedure.

17. The method according to claim 16, characterized in that the advancing device of the test head is provided with a path measuring device in such a manner that the advancing path of the test head (27) is measured while the force is increased.

18. The method according to claim 14, characterized in that a contact element (12) is marked with a test marking while the test procedure is being executed.

19. The method according to claim 10, characterized in that during the test procedure, the force exerted via the test head (27) is measured and/or the advancing path of the test head (27) is measured and in that a reshaping of a contact element (11, 12) for producing a mechanical joint between the contact element and a wire conductor (22), which is connected to the contact element, by a reshaping device acting upon the contact element (12) and is suppressed when a test force defined as a target value has fallen below or an advancing path defined as a maximal path be exceeded.

* * * * *